(12) United States Patent
Marsh et al.

(10) Patent No.: US 9,246,086 B2
(45) Date of Patent: Jan. 26, 2016

(54) CONDUCTIVE BRIDGE MEMORY SYSTEM AND METHOD OF MANUFACTURE THEREOF

(71) Applicant: Sony Corporation, Tokyo (JP)

(72) Inventors: Eugene Marsh, Boise, ID (US); Tim Quick, Boise, ID (US)

(73) Assignee: SONY CORPORATION, Tokyo (JP)

(*) Notice: Subject to any disclaimer, the term of this patent is extended or adjusted under 35 U.S.C. 154(b) by 125 days.

(21) Appl. No.: 14/044,696

(22) Filed: Oct. 2, 2013

(65) Prior Publication Data
US 2015/0090947 A1 Apr. 2, 2015

(51) Int. Cl.
*H01L 21/332* (2006.01)
*H01L 45/00* (2006.01)

(52) U.S. Cl.
CPC .......... *H01L 45/085* (2013.01); *H01L 45/1233* (2013.01); *H01L 45/1266* (2013.01); *H01L 45/145* (2013.01); *H01L 45/146* (2013.01); *H01L 45/16* (2013.01)

(58) Field of Classification Search
CPC .............. H01L 45/085; H01L 45/1226; H01L 45/1233; H01L 45/1253; H01L 45/1266; H01L 45/14; H01L 45/1608
See application file for complete search history.

(56) References Cited

U.S. PATENT DOCUMENTS

| | | | |
|---|---|---|---|
| 7,515,454 | B2 | 4/2009 | Symanczyk |
| 7,641,937 | B2 | 1/2010 | Choi |
| 7,811,633 | B2 | 10/2010 | Choi |
| 2011/0121254 | A1 | 5/2011 | Dressler et al. |
| 2011/0240948 | A1* | 10/2011 | Kagawa .................. H01L 45/12 257/4 |
| 2013/0001497 | A1 | 1/2013 | Ohba et al. |
| 2015/0008385 | A1* | 1/2015 | Hidaka .................. H01L 45/144 257/2 |

* cited by examiner

*Primary Examiner* — Thanh Y Tran
(74) *Attorney, Agent, or Firm* — Sheridan Ross P.C.

(57) ABSTRACT

A conductive bridge memory system and method of manufacture thereof including: providing a dielectric layer having a hole on a bottom electrode, the hole over the bottom electrode; forming an ionic source layer in the hole and over the bottom electrode including: depositing a reactivation layer over the bottom electrode, depositing a first ion source layer on the reactivation layer, depositing another of the reactivation layer on the first ion source layer, depositing a second ion source layer on the another of the reactivation layer; and forming an upper electrode on the ionic source layer.

15 Claims, 4 Drawing Sheets

US 9,246,086 B2

CONDUCTIVE BRIDGE MEMORY SYSTEM AND METHOD OF MANUFACTURE THEREOF

TECHNICAL FIELD

The present invention relates generally to a semiconductor memory system, and more particularly to a random access memory system.

BACKGROUND ART

The performance of non-volatile memory systems has improved over the past several years. Changes in technology management have pushed the non-volatile memory devices into cameras, computers, personal data assistants, smart phones, and proprietary business applications.

The current flash memory devices, based on charge storage technologies, have limited life spans due to damage of the charge storage layers during writes. The damage can be caused by physical weakening of the crystal structure used to store the charge. This condition is countered by limiting the number of writes and reads that an individual memory cell can undergo and balancing writes across all of the locations in the memory. The limited reliability of the cells has given rise to error correction strategies and distributed write operations in order to extend the useable life of the memory modules. Many maintenance processes can operate in background without the knowledge of the operator.

Other non-volatile memory technologies are in development that can increase the useable memory density while extending the lifetime reliability of the memory structures. These non-volatile memory technologies include spin transfer torque random access memory (STT-RAM), resistive random access memory, and programmable metallization memory.

Programmable metallization memories are also referred to as conductive bridge random access memory (CBRAM), each cell of which generally consists of an ionic source layer and an oxide film sandwiched between a bottom electrode and an upper electrode. Memory cell operation is due to formation/dissolution of a conductive bridge formed by electro-deposition of materials from the ionic source layer. In a current known fabrication method for CBRAM cells, layers are deposited by a physical vapor deposition (PVD) process. However, removal of sputter deposited materials from unwanted areas may leave residues which can damage cell performance. Further, PVD cannot be used in a damascene process to form confined memory cells.

Thus, a need still remains for a better conductive bridge memory system and method of manufacture thereof. In view of the push to ever-smaller devices and higher density memory, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a conductive bridge memory system including: providing a dielectric layer having a hole on a bottom electrode, the hole over the bottom electrode; forming an ionic source layer in the hole and over the bottom electrode including: depositing a reactivation layer over the bottom electrode, depositing a first ion source layer on the reactivation layer, depositing another of the reactivation layer on the first ion source layer, depositing a second ion source layer on the another of the reactivation layer; and forming an upper electrode on the ionic source layer.

The present invention provides a conductive bridge memory system, including: a bottom electrode; a dielectric layer having a hole over the bottom electrode; an ionic source layer in the hole and over the bottom electrode, the ionic source layer including: a reactivation layer over the bottom electrode, a first ion source layer on the reactivation layer, another of the reactivation layer on the first ion source layer, a second ion source layer on the another of the reactivation layer; and an upper electrode on the ionic source layer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
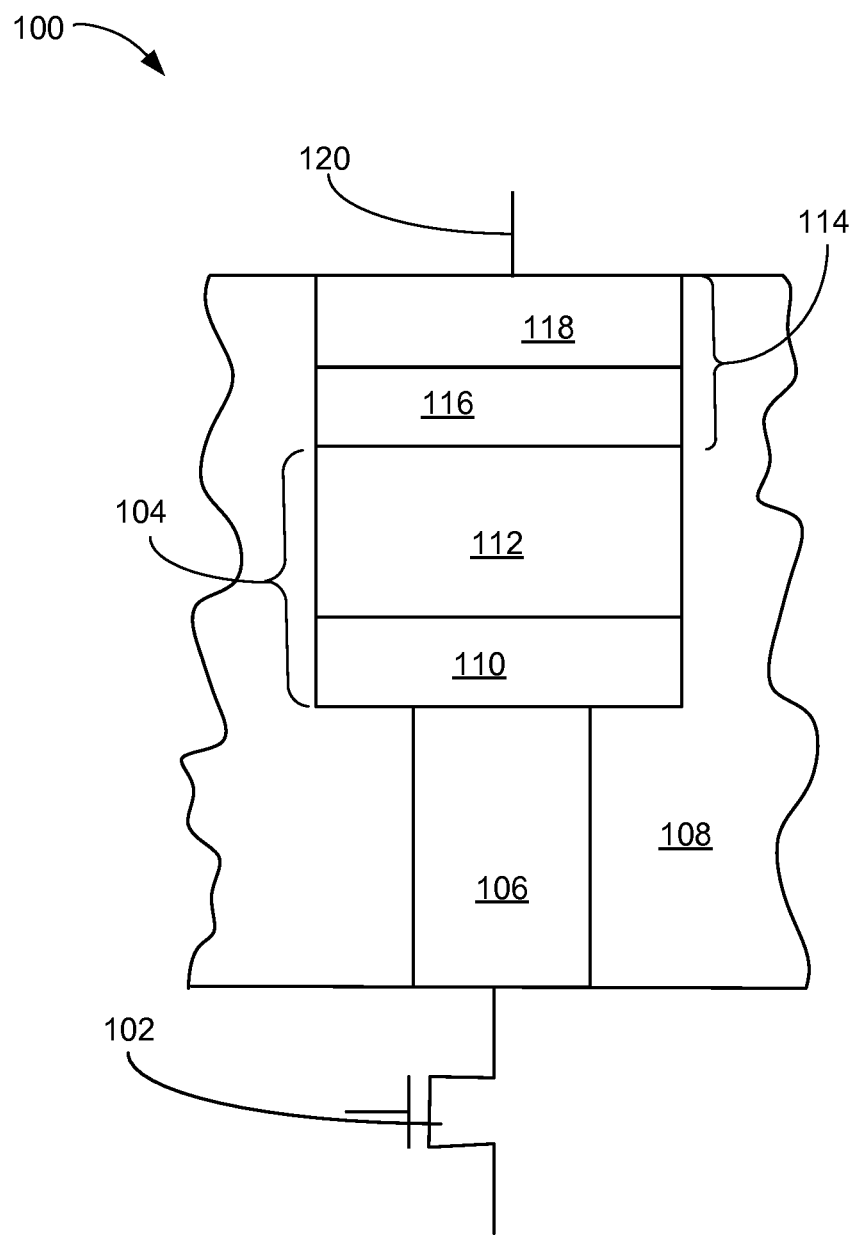
FIG. 1 is an architectural diagram of a conductive bridge memory system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the memory layer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Referring now to FIG. 1, therein is shown an architectural diagram of a conductive bridge memory system 100 in an embodiment of the present invention. The architectural diagram of the conductive bridge memory system 100 depicts a single memory cell having a transistor 102 coupled to a bottom electrode 106 in contact with a memory layer 104. It is understood that an array of memory cells together can form the conductive bridge memory system 100.

The bottom electrode 106 can be formed in and on a dielectric layer 108, such as a silicon nitride (SiN) layer or a silicon dioxide ($SiO_2$) layer, by a combination of masking, etching, and deposition. The bottom electrode 106 can be a metal structure formed of metals or alloys including platinum (Pt), titanium nitride (TiN), Ruthenium (Ru), tungsten (W), sulfur (S), tungsten nitride (WN), or a combination thereof. The bottom electrode 106 can be deposited by physical vapor deposition (PVD), chemical vapor deposition (CVD), sputtering, plating, or metal layer deposition in an opening that was etched in the dielectric layer 108.

The memory layer 104 includes an ionic source layer 112 on a resistance change layer 110 on the bottom electrode 106. The resistance change layer 110 can be formed by a deposition of a suitable insulating material or a semiconductor material such as a rare-earth oxide, a rare-earth nitride, a silicon oxide, or a silicon nitride, or specifically, such as gadolinium oxide ($Gd_2O_3$), aluminum oxide ($Al_2O_3$), or silicon oxide ($Si_2O_3$) on the bottom electrode 106, for example. The resistance change layer 110 is defined as an insulative layer which, in combination with the ionic source layer 112, can be switched between a high or low resistance state depending on a direction of an electric field (polarity of voltage) generated between an upper electrode 114 and the bottom electrode 106.

The ionic source layer 112 is defined as the source of ions for forming a conductive bridge between the upper electrode 114 and the bottom electrode 106, thereby reducing the resistance between the two electrodes. The ionic source layer 112 can be formed of a doped chalcogenide, or layers of alloys of Tellurium (Te), known as Telluride, and transition or main group metals, such as Copper telluride ($CuTe_x$), Aluminum telluride ($Al_2Te_x$), Zinc telluride ($ZnTe_x$), Nickel telluride ($Ni_2Te_x$), Zirconium telluride ($ZrTe_x$), and Silver telluride ($Ag_2Te_x$) in various configurations, for example. The combination of the resistance change layer 110 and the ionic source layer 112 can form the memory layer 104. The memory layer 104 can be manipulated, during operation, to reflect a low resistance state or a high resistance state by inducing the flow of ions from the ionic source layer 112 through the resistance change layer 110. The ionic source layer 112 can be from 50 to 1000 angstroms, with a thickness of 150 to 300 angstroms being the preferred thickness.

The upper electrode 114 can be formed on the top surface of the ionic source layer 112. The upper electrode 114 can be formed of an interface layer 116 deposited directly on the ionic source layer 112 and a cap layer 118 on the interface layer 116. The interface layer 116 can be formed by deposition of transition metals including titanium (Ti), silicon (Si), zirconium (Zr), or alloys, but it is understood that the material chosen for the interface layer 116 cannot be too reactive with the ionic source layer 112. For example, materials such as Silver (Ag) and Copper (Cu) can be completely consumed by the ionic source layer 112 when heated to the process temperature range of 200-450 degrees Celsius.

The cap layer 118 can be formed of low resistance metals or alloys including; Tungsten (W), Tungsten Nitride (WN), Titanium (Ti), and Titanium Nitride (TiN). The cap layer 118 can be formed of multiple layers of metals or alloys, which are chemically isolated from the ionic source layer 112. The multiple layers of the cap layer 118 can also include layers of Copper (Cu), Aluminum (Al), Tantalum (Ta), or alloys thereof. It is understood that other combinations of metal or alloys can be deposited on the interface layer 116 in single or multiple layers in order to form the cap layer 118 having a thickness in the range of 2-30 nm.

A voltage reference interconnect 120 can be coupled to the upper electrode 114 for providing the operational voltage required to operate the conductive bridge memory system 100. The memory cell shown in this view can be formed using a damascene process to form a confined memory cell.

Figure 2:
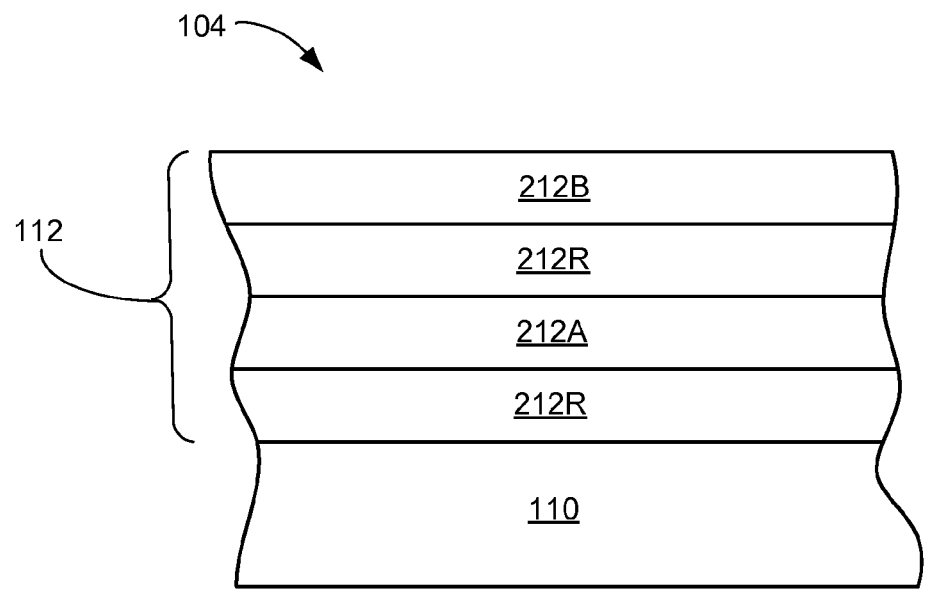
FIG. 2 is a detailed view of a portion of the memory layer.

Referring now to FIG. 2, therein is shown a detailed view of a portion of the memory layer 104. In this detailed view is shown an example of the various layers of the ionic source layer 112 of the memory layer 104 in a hole of the dielectric layer 108 of FIG. 1. For example, the various layers of the ionic source layer 112 can form an aluminum copper zirconium telluride film (AlCuZrTe film). The ionic source layer 112 may also contain other elements such as oxygen (O), germanium (Ge), silicon (Si), or nitrogen (N). The ionic source layer 112 may also contain other chalcogens. The wavy lines on the sides of the figure indicate that only a portion of each layer is shown.

The ionic source layer 112 can have a reactivation layer 212R (layer R), a first ion source layer 212A (layer A), and a second ion source layer 212B (layer B). The reactivation layer 212R, such as aluminum telluride (AlTe), the first ion source layer 212A, such as an early transition metal combined with Te such as zirconium telluride (ZrTe), and the second ion source layer 212B, such as a late transition metal combined with Te such as copper telluride (CuTe), can be deposited on the resistance change layer through a process such as chemical vapor deposition (CVD) or atomic layer deposition (ALD). The reactivation layer 212R can also be tellurium combined with an early main group metal other than Al.

The layers can be arranged in various ways. For example, the layers can be arranged on the resistance change layer 110 in a four-layer configuration such as ARBR, from top to bottom. Alternatively, the configuration can be of the form BRAR. In the BRAR configuration, the reactivation layer 212R can be directly on the resistance change layer 110, with the first ion source layer 212A on top of the reactivation layer 212R, followed by another of the reactivation layer 212R on the first ion source layer 212A, and the second ion source layer 212B on the another of the reactivation layer 212R. In this example, the four-layer configuration can be, from top to bottom, a CuTe layer on top of an AlTe layer on top of a ZrTe layer on top of another AlTe layer.

For illustrative purposes, a four-layer configuration is described, but it is understood that other layering configurations are possible, as long as there is an AlTe layer between each alternating CuTe and ZrTe layer. For example, 6 or more alternating layers can be in a configuration such as ARBRAR. Further, Cu could be replaced with an appropriate late transition metal, and Zr could be replaced by an appropriate early transition metal.

Figure 3:
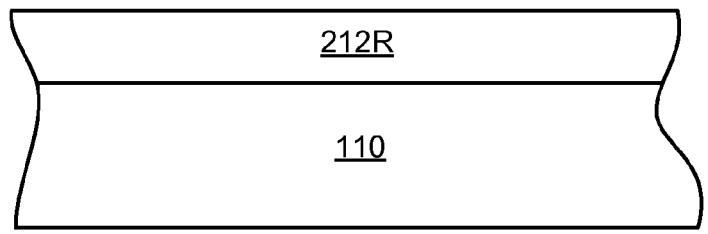
FIG. 3 is a cross-sectional view of the portion of the memory layer in a deposition phase of manufacture.

Referring now to FIG. 3, therein is shown a cross-sectional view of a portion of the memory layer 104 in a deposition phase of manufacture. The dielectric layer 108 of FIG. 1 can be masked with a pattern for creating confined memory cells and etched to form holes in the dielectric layer 108. The resistance change layer 110 can be deposited first into a hole in the dielectric layer 108. The reactivation layer 212R can be deposited in the hole via a CVD or ALD process on top of the resistance change layer 110. An exemplary CVD process for depositing the reactivation layer 212R as AlTe is shown in Table 1 below:

TABLE 1

| susecptor temperature | 350 C. |
|---|---|
| carrier gas flow rate | 100 sccm |
| pressure | 5 torr |
| Al precursor | trisdimethylamido aluminum (TDMAA) |
| Te reaction gas | di-tert-butyltelluride (DTBTe) |
| process steps | TDMAA 2 second pulse, 5 second purge |
| | DTBTe 1 second pulse, 5 second purge |

AlTe is deposited via the above process in a layer that can be between 5 and 50 angstroms thick. Other deposition processes such as physical vapor deposition, or sputtering, cannot be controlled precisely enough to deposit at these thicknesses.

Figure 4:
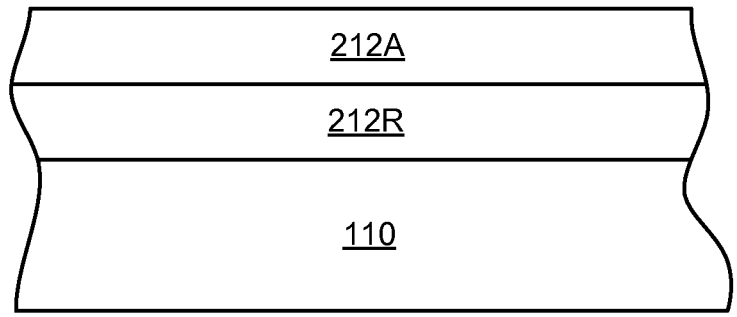
FIG. 4 is the structure of FIG. 3 in a further deposition phase of manufacture.

Referring now to FIG. 4, therein is shown the structure of FIG. 3 in a further deposition phase of manufacture. The first ion source layer 212A can be deposited, also in the hole in the dielectric layer 108 of FIG. 1, on top of the reactivation layer 212R through a process such as CVD or ALD. The reactivation layer 212R is on top of the resistance change layer 110. An exemplary CVD process for depositing the first ion source layer 212A as ZrTe on top of AlTe is shown in Table 2 below:

TABLE 2

| susecptor temperature | 350 C. |
|---|---|
| carrier gas flow rate | 100 sccm |
| pressure | 5 torr |
| Zr precursor | tetrakis(dimethylamino)zirconium (TDMAZ) |
| Te reaction gas | DTBTe |
| process steps | TDMAZ 2 second pulse, 5 second purge |
| | DTBTe 1 second pulse, 5 second purge |

ZrTe is deposited via the above process in a layer that can be between 5 and 50 angstroms thick. The Zr precursor is shown as TDMAZ though it is understood that any suitable precursor of the general chemical formula $Zr(NR_2)_4$ can be used. Other deposition processes such as physical vapor deposition, or sputtering, cannot be deposited in the desired structure or thicknesses.

Figure 5:
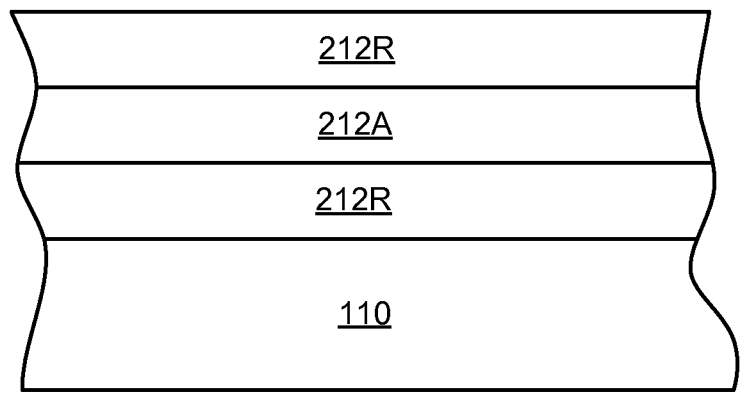
FIG. 5 is the structure of FIG. 4 in a further deposition phase of manufacture.

Referring now to FIG. 5, therein is shown the structure of FIG. 4 in a further deposition phase of manufacture. Another of the reactivation layer 212R can be deposited, also in the hole in the dielectric layer 108 of FIG. 1, via a CVD or ALD process on top of the first ion source layer 212A. An exemplary CVD process for depositing the reactivation layer 212R as AlTe on top of ZrTe is shown in Table 1 above.

AlTe is deposited via the above process in a layer that can be between 5 and 50 angstroms thick. Other deposition processes such as physical vapor deposition, or sputtering, cannot be deposited in the desired structures or thicknesses.

Following the deposition of the second of the reactivation layer 212R, the formation of the ionic source layer 112 of FIG. 1 on the resistance change layer 110 can be completed by deposition of the second ion source layer 212B, also in the hole in the dielectric layer 108 of FIG. 1, on top of the second of the reactivation layer 212R via a process such as a CVD or ALD process. An exemplary CVD process for depositing the second ion source layer 212B as CuTe on top of AlTe is shown in Table 3 below:

TABLE 3

| susecptor temperature | 350 C. |
|---|---|
| carrier gas flow rate | 100 sccm |
| pressure | 5 torr |
| Cu precursor | copper(n,n'-diisopropyl-2-dimetylamine-amidinate) (Cu(DMAPA)) |
| Te reaction gas | DTBTe |
| process steps | Cu(DMAPA) 4 second pulse, 5 second purge |
| | DTBTe 1 second pulse, 5 second purge |

CuTe is deposited via the above process in a layer that can be between 5 and 50 angstroms thick. Other deposition processes such as physical vapor deposition, or sputtering, cannot be controlled precisely enough to deposit at these thicknesses. Following the deposition of the second ion source layer 212B, the surface can be planarized using a process such as chemical mechanical planarization/polishing (CMP), completing a damascene process to form the memory layer 104 of FIG. 1. The upper electrode 114 of FIG. 1 can then be formed on top of the memory layer 104.

It has been discovered that layering ZrTe and CuTe using AlTe as an intermediate layer (the first ion source layer 212A and the second ion source layer 212B layered with the reactivation layer 212R as an intermediate layer) can allow the creation of aluminum copper zirconium telluride films in spite of being unable to cause CuTe to nucleate directly on ZrTe via CVD. Extensive testing with Cu(DMAPA), $CuKI_5$, and copper pivalate as precursors found that none would nucleate on a ZrTe surface. Attempts to nucleate on Zr or Te alone were unsuccessful. The ZrTe surface could not be reactivated via surface treatment using $NH_3$, $H_2$, alcohols, water, or formic acid either. However, it was found that AlTe would nucleate on ZrTe and reactivate the surface, allowing CuTe to nucleate on a previously inert surface. X-ray photoelectron spectrometry was used to confirm deposition and ensure atomic percentages were within appropriate ranges. Preferred ranges of atomic percentages for Cu, Al, Zr, and Te are from 5 to 95%.

The reactivation layer 212R (AlTe) reactivating ZrTe was an unexpected discovery because the aluminum precursor (Trisdimethylamido aluminum, or $Al(N(CH_3)_2)_3$) is comprised of the same ligands as the Zr precursor (Tetrakis(dimethylamino)zirconium, or $Zr(N(CH_3)_2)_4$), and the same reaction gas of di-tert-butyl telluride was used during the CVD process. It is expected that similar ligands should exhibit similar surface termination chemistry, and therefore it is unexpected that Cu or CuTe applied via CVD would exhibit significant reactivity differences between ZrTe and AlTe.

It has also been discovered that forming a confined memory cell via a damascene process having the ionic source layer 112 formed of a AlCuZrTe film with the first ion source layer 212A and the second ion source layer 212B with the reactivation layer 212R between them, all deposited in holes in the dielectric layer 108, at a specific thickness, cannot be done using a standard PVD technique but can be performed using CVD or ALD. Because sputtering or PVD cannot achieve the memory cell dimensions (with the first ion source layer 212A, the second ion source layer 212B, and the reactivation layer 212R being from 5 to 50 angstroms in thickness and in a confined memory cell) desired, CVD or ALD is preferred, and the reactivation of the first ion source layer 212A by the reactivation layer 212R is necessary to ensure proper deposition of the second ion source layer 212B.

Thus, it has been discovered that the conductive bridge memory system method of manufacture thereof of the present invention furnishes important and heretofore unknown and unavailable solutions, capabilities, and functional aspects for manufacturing memory layers containing AlCuZrTe films as the ionic source layer.

Figure 6:
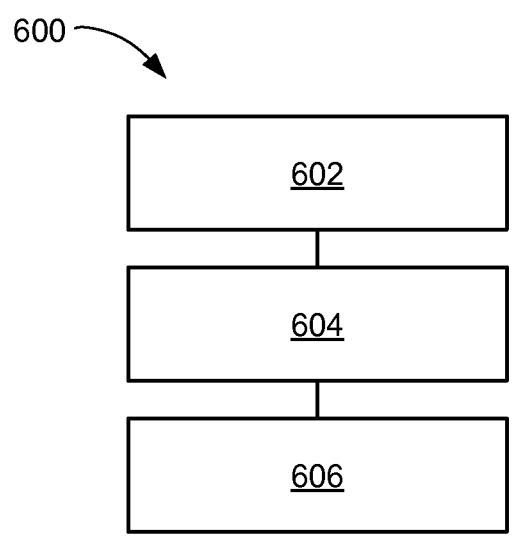
FIG. 6 is a flow chart of a method of manufacture of a conductive bridge memory system in a further embodiment of the present invention.

Referring now to FIG. 6, therein is shown a flow chart of a method 600 of manufacture of a conductive bridge memory system in a further embodiment of the present invention. The method 600 includes: providing a dielectric layer having a hole on a bottom electrode, the hole over the bottom electrode in a block 602; forming an ionic source layer in the hole and over the bottom electrode including: depositing a reactivation layer over the bottom electrode, depositing a first ion source layer on the reactivation layer, depositing another of the reactivation layer on the first ion source layer, and depositing a second ion source layer on the another of the reactivation layer in a block 604; and forming an upper electrode on the ionic source layer in a block 606.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing conductive bridge memory systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a conductive bridge memory system comprising:
providing a dielectric layer having a hole on a bottom electrode, the hole over the bottom electrode;
forming an ionic source layer in the hole and over the bottom electrode including:
depositing a reactivation layer over the bottom electrode,
depositing a first ion source layer on the reactivation layer,
depositing another of the reactivation layer on the first ion source layer,
depositing a second ion source layer on the another of the reactivation layer; and
forming an upper electrode on the ionic source layer.

2. The method as claimed in claim 1 further comprising forming a resistance change layer in the hole and on the bottom electrode.

3. The method as claimed in claim 1 wherein depositing the first ion source layer includes:
depositing an early transition metal; and
depositing a chalcogen.

4. The method as claimed in claim 1 wherein depositing the second ion source layer includes:
depositing a late transition metal; and
depositing a chalcogen.

5. The method as claimed in claim 1 wherein depositing the reactivation layer includes:
depositing an early main group metal; and
depositing a chalcogen.

6. The method as claimed in claim 1 further comprising:
forming a resistance change layer in the hole and on the bottom electrode; wherein:
depositing the reactivation layer includes depositing an early main group metal and a chalcogen;
depositing the first ion source layer includes depositing an early transition metal and a chalcogen; and
depositing the second ion source layer includes depositing a late transition metal and a chalcogen.

7. The method as claimed in claim 6 further comprising connecting a transistor to the bottom electrode.

8. The method as claimed in claim 6 wherein depositing the first ion source layer includes:
depositing zirconium; and
depositing tellurium.

9. The method as claimed in claim 6 wherein depositing the second ion source layer includes:
depositing copper; and
depositing tellurium.

10. The method as claimed in claim 6 wherein depositing the reactivation layer includes:
depositing aluminum; and
depositing tellurium.

11. A method of manufacture of a conductive bridge memory system comprising:
providing a dielectric layer having a hole on a bottom electrode, the hole over the bottom electrode;
forming a resistance change layer in the hole and on the bottom electrode;
forming an ionic source layer in the hole and on the resistance change layer including:
depositing a reactivation layer, having aluminum telluride, on the resistance change layer,
depositing a first ion source layer, having zirconium telluride, on the reactivation layer,
depositing another of the reactivation layer on the first ion source layer,
depositing a second ion source layer, having copper telluride, on the another of the reactivation layer; and
forming an upper electrode on the ionic source layer.

12. The method as claimed in claim 11 wherein forming the ionic source layer includes depositing materials by chemical vapor deposition or atomic layer deposition.

13. The method as claimed in claim 11 wherein depositing the first ion source layer having zirconium telluride includes providing a zirconium precursor having the general chemical formula of $Zr(NR_2)_4$ in a chemical vapor deposition process.

14. The method as claimed in claim 11 wherein depositing the second ion source layer having copper telluride includes reactivating a surface of the first ion source layer having zirconium telluride with the reactivation layer having aluminum telluride.

15. The method as claimed in claim 11 wherein depositing the second ion source layer having copper telluride includes providing a copper precursor in a chemical vapor deposition or atomic layer deposition process.

* * * * *